United States Patent [19]
Nishiguchi

[11] Patent Number: 5,525,835
[45] Date of Patent: Jun. 11, 1996

[54] SEMICONDUCTOR CHIP MODULE HAVING AN ELECTRICALLY INSULATIVE THERMALLY CONDUCTIVE THERMAL DISSIPATOR DIRECTLY IN CONTACT WITH THE SEMICONDUCTOR ELEMENT

[75] Inventor: Masanori Nishiguchi, Yokohama, Japan

[73] Assignee: Sumitomo Electric Industries, Ltd., Osaka, Japan

[21] Appl. No.: 232,346

[22] Filed: Apr. 22, 1994

Related U.S. Application Data

[63] Continuation of Ser. No. 925,259, Aug. 6, 1992, abandoned.

[30] Foreign Application Priority Data

| Aug. 8, 1991 | [JP] | Japan | 3-199554 |
| Aug. 8, 1991 | [JP] | Japan | 3-199558 |
| Aug. 8, 1991 | [JP] | Japan | 03-199561 |

[51] Int. Cl.⁶ .................... H01L 23/34; H01L 23/10; H02B 1/20; H02K 07/20
[52] U.S. Cl. .................... 257/712; 257/706; 257/719; 257/722; 257/724; 361/688; 361/692; 361/697; 361/713
[58] Field of Search .................... 361/388, 688, 361/692, 697, 702, 703, 704, 713; 257/712, 717, 718, 719, 723, 705, 678, 704, 705, 706, 710, 724, 796

[56] References Cited

U.S. PATENT DOCUMENTS

| 4,376,287 | 3/1983 | Sechi | 257/705 |
| 4,827,376 | 5/1989 | Voss . | |

FOREIGN PATENT DOCUMENTS

| 378209 | 7/1990 | European Pat. Off. . |
| 58-092241 | 6/1983 | Japan . |
| 60-137041 | 7/1985 | Japan . |
| 61-166051 | 7/1986 | Japan . |
| 62-114253 | 5/1987 | Japan . |
| 63-250847 | 10/1988 | Japan . |
| 2277251 | 11/1990 | Japan . |
| 3014261 | 1/1991 | Japan . |

OTHER PUBLICATIONS

Peterson, "Silicones with Improved Thermal Conductivity for Thermal Management in Electronic Packaging", Proceedings of the 40th Electronic Components & Technology Conference, May 20, 1990, pp. 613–619.

Watari et al, "Packaging Technology for the NEC SX Supercomputer", IEEE Transactions on Components, Hybrids and Manufacturing Technology, vol. 8, No. 4, Dec. 1985, pp. 462–467.

*Primary Examiner*—Sara W. Crane
*Assistant Examiner*—Carl Whitehead, Jr.
*Attorney, Agent, or Firm*—Cushman Darby & Cushman

[57] ABSTRACT

The semiconductor chip module according to the present invention comprises a semiconductor substrate on which a wiring portion is formed, a semiconductor chip 4 mounted so as to face a circuit side up to the wiring portion, a heat sink 3, 3a, 13 with one end contacted to the central portion of an upper surface of the semiconductor chip 4, 4a; and a cap which has an opening 2a for exposing the other end of the heat sink 3, 3a, 13 to the outside, the cap 2 enclosing all of the semiconductor chips 4, 4a. Accordingly, the heat generated from the semiconductor chips 4, 4a can be dissipated through the heat sink 3, 3a, 13 to the outside. It results in providing a semiconductor chip module without inconvenience for operation with high speed.

16 Claims, 4 Drawing Sheets

II−II′

SEMICONDUCTOR CHIP MODULE HAVING AN ELECTRICALLY INSULATIVE THERMALLY CONDUCTIVE THERMAL DISSIPATOR DIRECTLY IN CONTACT WITH THE SEMICONDUCTOR ELEMENT

This is a continuation of application Ser. No. 07/925,259 filed on Aug. 6, 1992, now abandoned.

BACKGROUND OF THE INVENTION

1. Field of the Invention

The present invention relates to a semiconductor chip module such as multi-chip module and single chip module applicable for the fields of computers and communications the like where high speed signal processing is required.

2. Related Background Art

With the increased demand for large-scale function and high speed operation of electronic devices, logic LSIs have achieved high speed operation, with a delay time per gate of several hundreds picosecond. However, the conventional assembling structure which mounts a large number of dual-in packages (DIPs) or plug-in packages on a printed circuit board has become difficult to bring out performance of high speed LSIs sufficiently. In order to overcome such a problem, a multi-chip module system has been developed and put into practical use, which mounts large number of chips on a single ceramic substrate and can provide high speed performance with high density assembling (refer to "LSI HANDBOOK", the first edition, pp. 415–416, The Institute of Electronics and Communication Engineers of Japan, 1984).

In the conventional type of multi-chip module system which mounts semiconductor chips with face up bonding method and dissipates the heat generated by semiconductor chips toward the substrate side, the heat dissipation has been preventing the performance of the semiconductor chip module from becoming aggravated due to the heat resistance.

It was, however, not possible to obtain adequate heat dissipation by this system. Accordingly, the performance of the semiconductor chip module gradually becomes aggravated, the rate of failure is increased, and it becomes impossible to use the semiconductor chip module over a long term.

SUMMARY OF THE INVENTION

An object of the present invention is to provide a semiconductor chip module capable of satisfactory design for adequate dissipation of heat without aggravation of the performance.

The semiconductor chip module according to a first aspect of the present invention comprises a semiconductor substrate on which a wiring portion is formed, a semiconductor chip mounted so as to face a circuit side up to the wiring portion, a heat sink with one end thereof contacted to the central portion of an upper surface of the semiconductor chip; and a cap which has an opening for exposing the other end of the heat sink to the outside thereof, the cap enclosing the semiconductor chips.

According to the semiconductor chip module of the first aspect of the present invention, the heat generated from the semiconductor chip of face-up type is conducted from the one end of the heat sink contacted with the upper surface of the semiconductor chip to the other end thereof. This heat conduction results in heat flow outside the cap which is then dissipated. Furthermore, there is no drawback of short circuiting between pads in the cause of the heat sink because the heat sink is mounted so as to contact with the central portion of the face-up surface of the semiconductor chip to avoid a contact with pads arranged on the peripheral portion of the semiconductor chip.

The semiconductor chip module according to a second aspect of the present invention comprises a semiconductor substrate on which a wiring portion is formed; a semiconductor chip mounted so as to face a circuit side up to the wiring portion; a heat sink with one end thereof contacted to the central portion of an upper surface of the semiconductor chip; a cap which has an opening for exposing the other end of the heat sink to the outside thereof, the cap enclosing the semiconductor chips, and an insulating material which coats a bonding wire for connecting the semiconductor substrate and the semiconductor chip.

According to the semiconductor chip module of the second aspect of the present invention, the heat generated from the semiconductor chip of face-up type is conducted from the one end of a heat sink contacted with the upper surface of the semiconductor chip to the other end thereof. This heat conduction results in heat being introduced outside the cap and then dissipated.

Further, a bonding wire, connecting a semiconductor substrate and semiconductor chips mounted thereon, is coated with insulating material. Therefore, even though a heat sink is made of conductive material, there is no aggravation in electric performance due to short circuiting between the heat sink and the bonding wire. Thus, it is possible to apply a large size of the heat sink.

The semiconductor chip module according to a third aspect of the present invention comprises a semiconductor substrate on which a wiring portion is formed; a semiconductor chip mounted so as to face a circuit side up to the wiring portion; a heat sink with one end thereof contacted to the central portion of an upper surface of the semiconductor chip; a cap which has an opening for exposing the other end of the heat sink to the outside thereof, the cap enclosing the semiconductor chips, and an insulating thermal compound material placed on almost whole surface of the semiconductor chip so as to contact both said one end of the heat sink and the surface of the semiconductor chip.

According to the semiconductor chip module of the third aspect of the present invention, the heat generated from the semiconductor chip of face-up type is conducted from the one end of the heat sink contacted with the upper surface of the semiconductor chip to the other end thereof. This heat conduction results in heat being introduced outside the cap and then dissipated.

Especially, a insulating thermal compound material is placed on almost whole surface of semiconductor chip, heat produced from the peripheral portion of the semiconductor chip which has I/O circuit, etc. causing relatively a great amount of heat, can be conducted to the heat sink through the thermal compound material.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Figure 1:
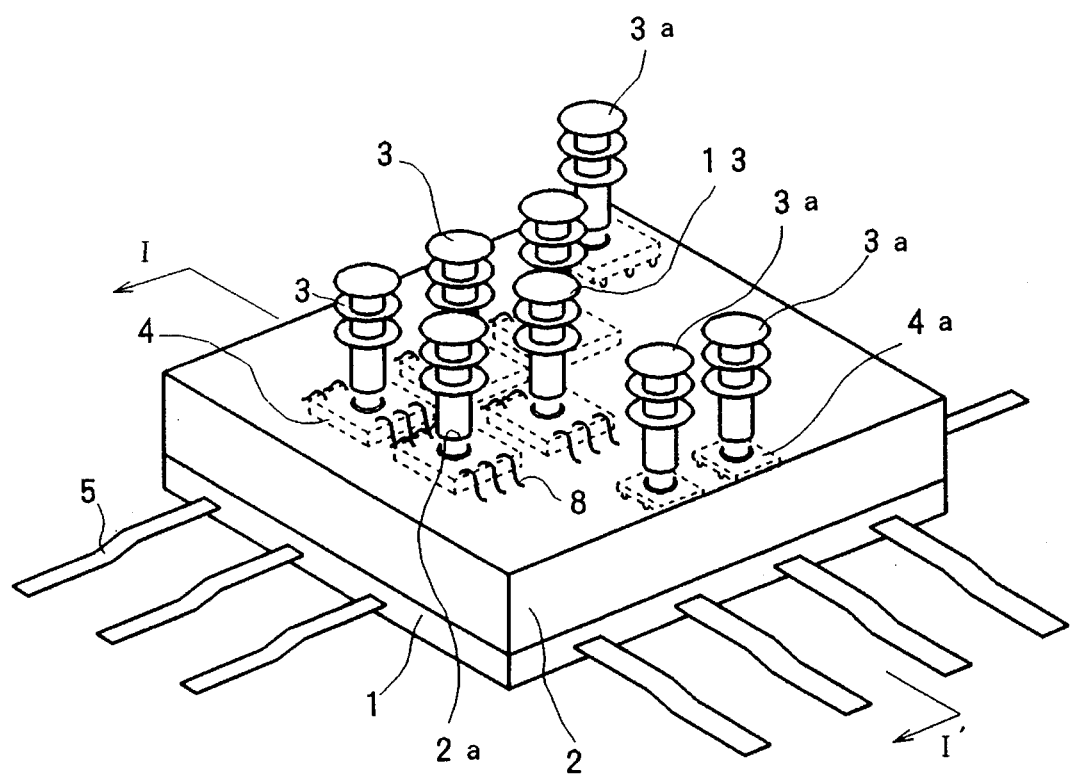
FIG. 1 is a perspective view showing an appearance of a multi-chip module according to the present invention.
Figure 2:
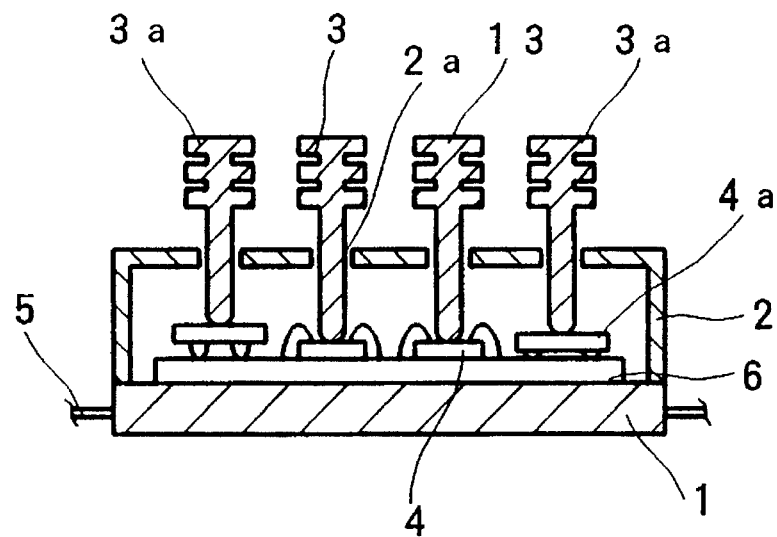
FIG. 2 is a cross sectional vertical view showing a multi-chip module taken along the vertical direction of a heat sink.

First of all, a basic structure of the semiconductor chip module according to the present invention is explained in reference with FIG. 1 and FIG. 2.

The lower substrate 1 is made of aluminum oxide material, for example, and has plural lead pins 5 extending from the side surface thereof. The lead pins 5 are connected to an electric wiring formed on the upper substrate 6. The upper substrate 6 is made of insulating material of low dielectric constant. For example, a polyimide multi-layered wiring structure having three inches square size, a thermal resistance of 3° C./W with a thermal via may be used (refer to "Copper Polyimide Multi-layered Wiring Boards", HYBRIDS, Vol. 7, No. 1, pp. 10–12).

The lower substrate 1 is formed of a plate larger than the upper substrate 6, and the upper substrate 6 is piled securely on the upper surface thereof. The fringe of the cap 2 covers the upper surface of the lower substrate 1 which is not covered by the upper substrate 6. For that reason, the upper substrate 6 is enclosed with the cap 2 and the lower substrate 1. The upper substrate 6 has electrodes exposed on the surface thereof and face-up type semiconductor chips 4 and face-down type of semiconductor chips 4a connected to the electrodes are mounted thereon as shown in the figure. The face-up type semiconductor chips 4, as indicated by its literal name, have a circuit side up. A wiring portion of the upper substrate 6 is connected to the face-up type semiconductor chips 4 electrically by wire bonding method. And the face-down type semiconductor chips 4a have a circuit side down so as to connect with wiring portion of the upper substrate 6 electrically by die bonding method.

Also, the cap 2, for example, is formed of 1 mm thick Kovar in a shape of a lid. An opening 2a with an inner diameter of 30 to 50 μm is formed in the cap 2 at the position corresponding to the mounting position of the face-up type semiconductor chip 4 or the face-down type semiconductor chip 4a. One end of the heat sink 3, 3a, 13 is inserted into the opening 2a. For the material of cap 2, metal such as aluminum, copper tungsten alloy, etc., or ceramics such as AlN, SiC can be used.

The heat sink 3, 3a, 13 mentioned above are made of material of high heat conductivity such as Al and CuW and includes an insertion portion and a heat dissipation portion. The insertion portion has a shape which allows to be easily inserted into above mentioned opening 2a, for example, a rod shape. And the heat dissipation portion has a structure with a large surface area to get easily cooled by natural cooling, for example, formed in a disc shape. As the number of stages of dissipation portion is increased, the speed of cooling is generally increased. For that reason, the insertion of the heat sink 3, 3a, 13 into the interior of the cap 2 is simple and the heat generated from the face-up type semiconductor chips 4 can be dissipated to the outside of the cap 2 effectively. It is preferable in order to conduct the heat effectively from the face-up type semiconductor chip 4 to the heat sink 3, 13 that the contacting state between heat sink 3, 13 and the surface of the semiconductor chip 4 is surface contact. Accordingly, the tip end of the insertion portion of the heat sink 3, 13 is preferably flat in case that the upper surface of the semiconductor chip 4 is flat.

Where the material of the heat sink 3 is conductive material such as Al or CuW, the tip area of heat sink 3 must be relatively small to avoid short circuiting between the bonding wire and TAB pads. If it is, however, insulating material such as AlN or cubic phase boron nitride (CBN), etc., the degree of over design and freedom becomes high since the contact with bonding wire does not cause a serious problem.

Moreover, the outside diameter of the heat sink is basically determined according to the heat generation area of the semiconductor chip. For example, in the case that 10 mm square IC chip which generates heat from the whole upper surface thereof, a heat sink having 10 mm diameter may be preferably used. If the heat generation area is a part of the upper surface of the semiconductor chip, a heat sink having a diameter to cover the area may be used. Further, the size of the opening 2a of the cap 2 is preferably larger than the heat sink 3, 3a, 13 to be inserted therein by 0.05 mm where the material of the cap 2 is metal and 0.1 mm where the material of the cap 2 is ceramics.

Next, mounting structure of the heat sink applicable for a multi-chip module according to the first embodiment of the present invention is explained.

Figure 3:
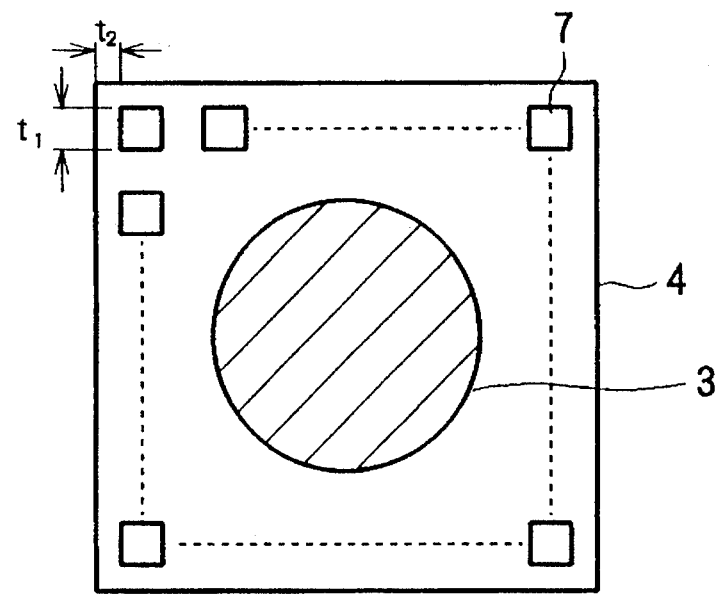
FIG. 3 is an enlarged plan view showing a semiconductor chip which can be used for a multi-chip module according to the first embodiment of the present invention.

FIG. 3 is a top view showing a face-up type semiconductor chip 4 mounted on the semiconductor chip module according to the first embodiment. The peripheral portion of this semiconductor chip 4 has pads 7 along the dotted line in the figure, the heat sink 3 is arranged on the central portion of the semiconductor chip 4.

In this case, as it is possible to have the pad 7 with the size of 80 μm if Au wire of 25 μm is used for the bonding wire 8, it becomes possible to contact the heat sink 3 with the semiconductor chip 4 except the narrow area covering 130 μm for one side of the semiconductor chip 4 and the total area of 260 μm for both sides where the pads 7 are arranged only on the peripheral portion thereof and the distance between the pad end and the chip end is 50 μm. The thermal resistance can be lowered from 10° C./W to about 5° C./W for this structure.

Further, the surface of the face-up type semiconductor chip 4 except the area where pads 7 are formed is protected with a passivation film such as SiN or SiON. Accordingly, there is no drawback even if heat sink 3 is contacted with the circuit side of the semiconductor chip.

The multi-chip module according to the first embodiment is packaged with the steps of: enclosing a top surface of the upper substrate 6 fixed on the lower substrate 1 with a cap 2; inserting one end of heat sink 3 into a opening 2a of the cap 2 to contact the tip end thereof with an upper surface of semiconductor chip 4; and fixing the heat sink 3 with the cap 2 by putting solder into the gap between the opening 2a of cap 2 and the heat sink 3 while the heat sink 3 is in contact with the semiconductor chip 4, for example.

Also, all semiconductor chips have heat sink 3 thereon in this embodiment, but the heat sink 3 may be selectively applied to the semiconductor chips 4 which produce a large amount of heat. As stated above, one heat sink 3 is applied for one semiconductor chip 4, it is assured that a heat sink 3 is mounted on a semiconductor chips 4 even though plural semiconductor chips are mounted on the substrate surface with different height from the substrate surface.

As the multi-chip module of the first embodiment has the structure described above, the heat sink 3 is mounted on each of the semiconductor chips 4. For that reason, it is possible to design a semiconductor structure in dissipation well and there is no inconvenience for designing a semiconductor chip module which can operate with high speed. Also, it is possible to lower the heat resistance of face-up type semiconductor chip 4. Further, as one heat sink 3 can be mounted selectively on one semiconductor chip 4, heat resistance can be reduced even in the case of multi-chip module having face-up type semiconductor chip 4 and face-down type semiconductor chip 4a.

Next, a multi-chip module according to the second embodiment of the present invention is explained in reference with FIGS. 1, 2, 4A and 4B. This multi-chip module is different from the embodiment described above since this multi-chip module uses a heat sink made of conductive material, a wire made of conductive material being coated with insulating material.

In general, a conductive heat sink has better heat conductivity and dissipation efficiency rather than a insulating heat sink. Considering this point, it is preferable to use a conductive heat sink. Also, the dissipation efficiency increases as the size of the heat sink become larger.

It, however, arises an anxiety that the electric characteristics become aggravated due to a contact with the bonding wire 8 in case that a large heat sink is used. Therefore, the embodiment uses the bonding wire 8 coated with insulating material 8b such as urethane of 0.5 to 0.7 μm thickness, etc. so as to allow the use of conductive heat sink 13 in large size. Because of this, the conductive heat sink 13 may contact with the bonding wire 8 and the heat sink 13 may be in a large size. These result in the improvement of dissipation for semiconductor chip module.

Further, the circuit surface of the semiconductor chips 4 is protected with a passivation film such as SiN or SiON. Accordingly, there is no drawback even if heat sink 13 is contacted with the circuit side of the semiconductor chip 4.

Figure 4A:
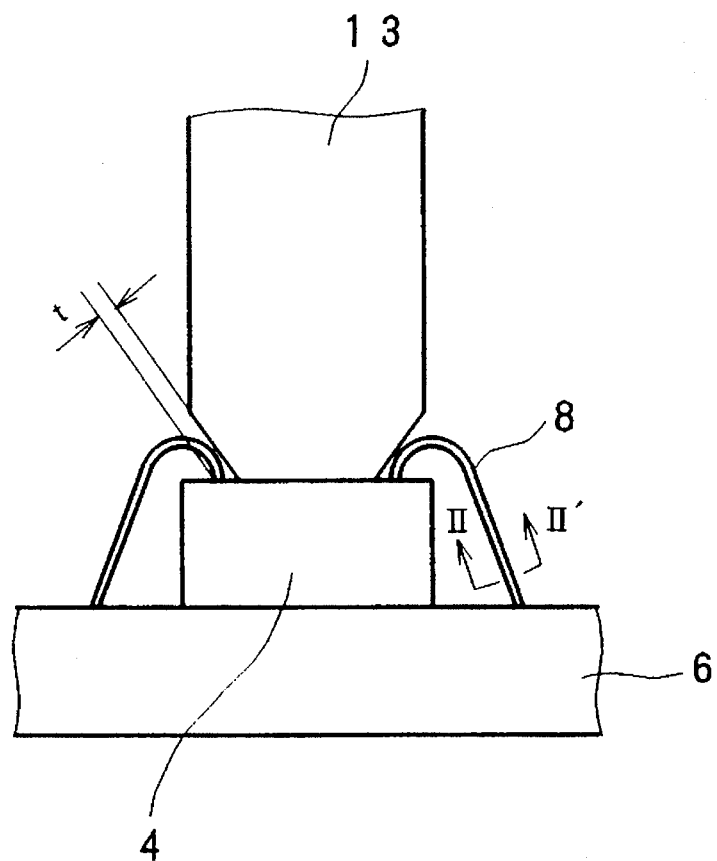
FIG. 4A is an enlarged side view showing a mounting structure of the heat sink which can be used for a multi-chip module according to the second embodiment of the present invention.
Figure 4B:
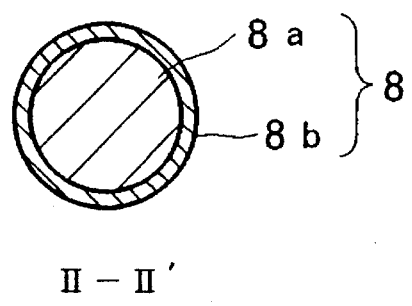
FIG. 4B is an enlarged cross sectional view showing a bonding wire taken along the plane II—II' of FIG. 4A.

The detail is explained in reference with FIGS. 4A and 4B. As the bonding wire 8 is coated with insulating material 8b (See FIG. 4B), it allows that the gap "t" between the heat sink 13 and the bonding wire 8 can be decreased to the contacting state of them. Therefore, the heat sink 13 can be in a large size.

Also, as there is no bad effect in electrical characteristics where the heat sink 13 is contacted with bonding wire 8 more or less, it is possible to manufacture the parts in reduced equipment tolerance and production tolerance, thus, the yield is improved.

Further, the cost of materials may be lowered since conductive material such as Al and CuW, etc., being cheaper than insulating material such as AlN, cubic phase boron nitride, diamond, etc., can be used.

Moreover, it is necessary to pay attention not to decline the mechanical reliability while it does not matter whether or not the heat sink 13 may be contacted electrically with the bonding wire 8 more or less.

The multi-chip module according to the second embodiment is packaged with the steps of: enclosing a top surface of the upper substrate 6 having the face-up type semiconductor chip 4 and the face-down type semiconductor chip 4a thereon and fixed on the lower substrate 1 with a cap 2; inserting one end of heat sinks 3, 3a, 13 into a openings 2, 2a to contact the tip end thereof with the upper surface of semiconductor chip 4, 4a; and fixing the heat sinks 3, 3a, 13 on the cap 2 by putting solder into the gap between the openings 2, 2a of cap 2 and the heat sinks 3, 3a, 13 while the heat sinks 3, 3a, 13 are in contact with the semiconductor chip 4, 4a, for example.

Figure 5:
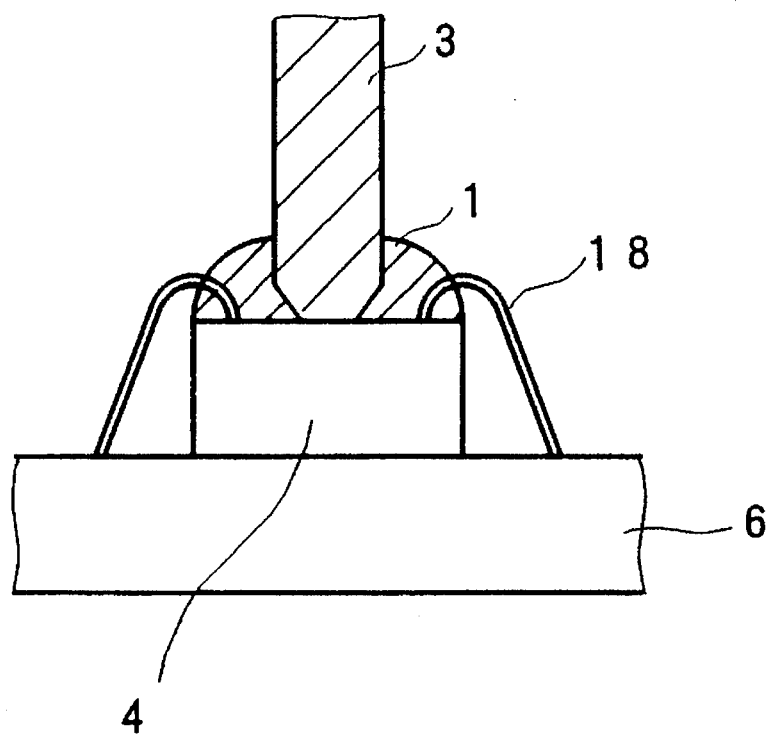
FIG. 5 is an enlarged cross sectional vertical view showing a mounting structure of the heat sink which can be used for a multi-chip module according to the third embodiment of the present invention.

Next, a multi-chip module according to the third embodiment of the present invention is explained in reference with FIG. 1, 2 and 5. This multi-chip module is different from the above mentioned embodiments since this multi-chip module has an insulating thermal compound material placed on almost whole surface of semiconductor chips.

Also a thermal compound material is placed on almost whole surface of each of the face-up type semiconductor chip 4. It is for improving the dissipation of heat. As it is desired to avoid the contact between the bonding wire 8 and the heat sink 3 as much as possible, the heat sink 3 should not be contacted with the semiconductor chip 4 except the central portion thereof.

Accordingly, the heat dissipated outside is mainly the heat generated from the central portion of the semiconductor chip 4 with which the heat sink 3 contacts. And the heat generated from the peripheral portion of the I/O circuit of the semiconductor chip 4 is not sufficiently absorbed by the heat sink, but is dissipated to the substrate side.

It is important to dissipate the heat generated from the I/O circuit portion through the heat sink effectively because the peripheral portion of the I/O circuit generates a great amount of heat in general. If insulating thermal compound material is placed on almost whole area of the face-up type semiconductor chip like the present embodiment (FIG. 5), the heat from not only the central portion of the semiconductor chip but the peripheral I/O circuit portion thereof can be conducted to the heat sink 3. As the thermal compound material 1 is insulating, there is no problem in performance of the semiconductor chip 4 even if the thermal compound material 1 is placed on whole area of the semiconductor chip 4 and contacts with the bonding wire 8. The insulating thermal compound material 1 may be made of epoxy resin contained a great amount of e.g. finely powdered diamond or cubic phase boron nitride (CBN).

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A semiconductor chip module enclosing multiple semiconductor chips, said semiconductor chip module comprising:

a first substrate having an upper surface which is circuitized;

a semiconductor chip having an upper surface side, contacting portions being located at a periphery of said upper surface side, said semiconductor chip being mounted on said upper surface of said first substrate;

a heat sink having a first end and a second end, said first end of said heat sink being in direct contact with said upper surface of said semiconductor chip and having a smaller surface area than said second end of said heat sink; and a cap having an opening for exposing said second end of said heat sink to an area outside of said module, said cap enclosing said semiconductor chips.

2. A semiconductor chip module according to claim 1, further comprising:

a second substrate having a mounting portion and a fixing portion, said mounting portion being used for mounting said first substrate, said fixing portion being used for fixing a peripheral portion of said cap, said second substrate being used for enclosing said semiconductor chip with said cap.

3. A semiconductor chip module according to claim 1, having plural electrode pads arranged around said semiconductor chip.

4. A semiconductor chip module according to claim 1, further comprising:

a bonding wire connecting said semiconductor chip with the wiring of said first substrate, said bonding wire being coated with an insulating material.

5. A semiconductor chip module according to claim 4, further comprising:

a second substrate having a mounting portion and a fixing portion, said mounting portion being used for mounting said first substrate, said fixing portion being used for fixing a peripheral portion of said cap, said second substrate being used for enclosing said semiconductor chip with said cap.

6. A semiconductor chip module according to claim 4, having plural electrode pads arranged around said semiconductor chip.

7. A semiconductor chip module according to claim 4, wherein said heat sink is made of electrically conductive material and the central portion of the upper surface of said semiconductor chip is covered with insulating film.

8. A semiconductor chip module according to claim 1, further comprising:

an insulating resin material with high heat conductivity being placed on almost whole surface of said semiconductor chip so as to contact both the upper surface of said semiconductor chip and the one end of said heat sink.

9. A semiconductor chip module according to claim 8, wherein said resin material is a thermal compound material.

10. A semiconductor chip module according to claim 9, further comprising:

a second substrate having a mounting portion and a fixing portion, said mounting portion being used for mounting said first substrate, said fixing portion being used for fixing a peripheral portion of said cap, said second substrate being used for enclosing said semiconductor chip with said cap.

11. A semiconductor chip module according to claim 8, having plural electrode pads arranged around said semiconductor chip.

12. A semiconductor chip module according to claim 8, wherein said heat sink is made of conductive material and the central portion of the upper surface of said semiconductor chip is covered with insulating film.

13. A semiconductor chip module according to claim 8, further comprising:

a bonding wire connecting said semiconductor chip with the wiring of said first substrate, said bonding wire being coated with an insulating material.

14. A semiconductor chip module according to claim 1, wherein said first end of said heat sink is partially cut so as to avoid direct contact with a bonding wire.

15. A semiconductor chip module according to claim 1, further comprising an insulating film covering a surface of said heat sink.

16. A semiconductor chip module according to claim 1, further comprising an insulating film covering a surface of said bonding wire.

* * * * *